(12) United States Patent
Tabatake

(10) Patent No.: US 11,489,034 B2
(45) Date of Patent: Nov. 1, 2022

(54) TFT ARRAY SUBSTRATE AND DISPLAY DEVICE

(71) Applicant: Japan Display Inc., Minato-ku (JP)

(72) Inventor: Hiroshi Tabatake, Minato-ku (JP)

(73) Assignee: Japan Display Inc., Tokyo (JP)

(*) Notice: Subject to any disclaimer, the term of this patent is extended or adjusted under 35 U.S.C. 154(b) by 375 days.

(21) Appl. No.: 16/852,885

(22) Filed: Apr. 20, 2020

(65) Prior Publication Data

US 2020/0251549 A1 Aug. 6, 2020

Related U.S. Application Data

(63) Continuation of application No. PCT/JP2018/026154, filed on Jul. 11, 2018.

(30) Foreign Application Priority Data

Oct. 30, 2017 (JP) .............................. JP2017-209446

(51) Int. Cl.
*H01L 27/32* (2006.01)
*H01L 51/00* (2006.01)
(Continued)

(52) U.S. Cl.
CPC ........ *H01L 27/3276* (2013.01); *G06F 1/1652* (2013.01); *G06F 1/189* (2013.01);
(Continued)

(58) Field of Classification Search
CPC ............. H01L 51/0097; H01L 51/5253; H01L 27/3258; H01L 27/5253; H01L 27/3279; H01L 27/124; H01L 27/3276
See application file for complete search history.

(56) References Cited

U.S. PATENT DOCUMENTS

2011/0260180 A1  10/2011  Kuranaga et al.
2012/0120616 A1* 5/2012  Katsui ................. H01L 27/3276
                                                 174/257
(Continued)

FOREIGN PATENT DOCUMENTS

CN     108899340 A  * 11/2018  ......... H01L 27/3276
EP     2461309 A1   *  6/2012  ....... G02F 1/136286
(Continued)

OTHER PUBLICATIONS

International Search Report dated Sep. 18, 2018 in PCT/JP2018/026154 filed Jul. 11, 2018, 3 pages.
(Continued)

*Primary Examiner* — Errol V Fernandes
*Assistant Examiner* — Jeremy J Joy
(74) *Attorney, Agent, or Firm* — Maier & Maier, PLLC

(57) ABSTRACT

In the second area, the lower base surface of the wirings is in contact with the first inorganic insulating film including a stepped portion including upper surfaces having mutually different heights and being adjacent to each other in the second direction, and a stepped surface rising from the upper surfaces except the uppermost surface. The first inorganic insulating film constitutes at least the upper surfaces except the lowest surface, and the stepped surface. The adjacent wirings include a pair of convex portions protruding toward a direction facing each other. One and the other of the pair of convex portions are separated to face each other at a position where the stepped portion does not exist in the second area in the first inorganic insulating film.

13 Claims, 21 Drawing Sheets

(51) Int. Cl.
*H01L 51/52* (2006.01)
*G06F 1/16* (2006.01)
*G06F 1/18* (2006.01)
*G09F 9/30* (2006.01)

(52) U.S. Cl.
CPC .......... *G09F 9/301* (2013.01); *H01L 27/3246* (2013.01); *H01L 27/3248* (2013.01); *H01L 27/3258* (2013.01); *H01L 51/0097* (2013.01)

(56) References Cited

U.S. PATENT DOCUMENTS

| | | | |
|---|---|---|---|
| 2013/0181204 A1 | 7/2013 | Kuranaga et al. | |
| 2016/0035759 A1* | 2/2016 | Kwon | H01L 27/1225 438/151 |
| 2016/0087022 A1* | 3/2016 | Tsai | H01L 27/1225 257/40 |
| 2016/0174304 A1* | 6/2016 | Kim | H01L 51/0097 313/511 |
| 2017/0040406 A1 | 2/2017 | Park et al. | |
| 2017/0077447 A1* | 3/2017 | Kang | H01L 27/3276 |
| 2017/0092708 A1* | 3/2017 | Jeon | H01L 27/3258 |
| 2017/0262109 A1* | 9/2017 | Choi | H01L 27/3258 |
| 2017/0288009 A1* | 10/2017 | Kim | H01L 27/3262 |
| 2017/0294620 A1* | 10/2017 | Park | H01L 51/5284 |
| 2018/0108723 A1* | 4/2018 | Nishimura | H01L 51/5253 |
| 2018/0138431 A1* | 5/2018 | Nishimura | H01L 27/3276 |
| 2018/0269427 A1* | 9/2018 | Park | H01L 51/5256 |
| 2019/0341442 A1* | 11/2019 | Kajiyama | H05B 33/12 |
| 2020/0066821 A1* | 2/2020 | Saitoh | H05B 33/10 |
| 2020/0119131 A1* | 4/2020 | Ohara | H01L 51/50 |
| 2020/0127075 A1* | 4/2020 | Sato | G06F 3/0446 |
| 2020/0251549 A1* | 8/2020 | Tabatake | H01L 51/0097 |
| 2020/0388660 A1* | 12/2020 | Saitoh | G09F 9/30 |
| 2021/0066440 A1* | 3/2021 | Okabe | H01L 27/3276 |

FOREIGN PATENT DOCUMENTS

| | | | | |
|---|---|---|---|---|
| JP | 11-24101 A | | 1/1999 | |
| JP | 11024101 A | * | 1/1999 | |
| JP | 11-52417 A | | 2/1999 | |
| JP | 11052417 A | * | 2/1999 | |
| JP | 2001-272685 A | | 10/2001 | |
| JP | 2011-227369 A | | 11/2011 | |
| JP | 2015046581 A | * | 3/2015 | ............ G06F 3/041 |
| JP | 2018-66819 A | | 4/2018 | |
| JP | 2018066819 A | * | 4/2018 | ......... H01L 27/1218 |
| KR | 2017024629 A | * | 3/2017 | ....... G02F 1/133345 |
| KR | 2017106621 A | * | 9/2017 | ....... G02F 1/133305 |
| WO | WO-2011013434 A1 | * | 2/2011 | ....... G02F 1/136286 |
| WO | WO 2016/048385 A1 | | 3/2016 | |
| WO | WO-2016048385 A1 | * | 3/2016 | ......... H01L 27/1225 |

OTHER PUBLICATIONS

Japanese Office Action dated Jun. 22, 2021 in Japanese Patent Application No. 2017-209445 (with unedited computer generated English translation), 15 pages.

\* cited by examiner

TFT ARRAY SUBSTRATE AND DISPLAY DEVICE

CROSS-REFERENCE TO RELATED APPLICATION

This application is a continuation application of International Application PCT/JP2018/026154 filed on Jul. 11, 2018, which claims priority from Japanese patent application JP2017-209446 filed on Oct. 30, 2017. The contents of these applications are incorporated herein by reference in their entirety.

BACKGROUND

1. Field

The present invention relates to a display device.

2. Description of the Related Art

As a display device, a flexible display having flexibility has been developed. For example, a display device in which a circuit layer and an organic electroluminescent layer are formed on a resin substrate having flexibility is known (JP 2011-227369 A). A resin substrate having flexibility is manufactured by forming a resin layer on a glass substrate, curing the resin layer and peeling the cured resin layer from the glass substrate.

An insulating layer and a wiring layer are laminated on the resin substrate, and the insulating layer is removed from a bending target region, thereby making the flexible display easy to be bent. The insulating layer is partially removed to form a step. Therefore, the etching of the conductive film is performed when forming the wiring on the insulating layer, and the conductive film is likely to remain between adjacent wirings, causing short circuit.

JP 2001-272685 A discloses that the resist residue is eliminated from a step portion in a photolithography process by placing a reflecting plate under the wiring, but does not disclose measures when the conductive film remains between adjacent wirings due to causes other than the resist residue.

JP H11-52417 A discloses that an opening is formed in the interlayer insulating film, but does not correspond to a structure in which the wiring passes through the stepped portion on a lower base surface from a lower stage to an upper stage.

JP H11-24101 A discloses that by forming a convex portion in a thick interlayer insulating film, the resist residue is eliminated when a photoresist formed thereon is exposed and washed, but does not disclose measures when the conductive film remains between adjacent wirings due to causes other than the resist residue.

SUMMARY

An object of the present invention is to prevent a short circuit between wirings.

A TFT array substrate includes a flexible substrate having a width in a first direction and a length in a second direction orthogonal to the first direction, and including a first area and a second area adjacent to each other in the second direction; a circuit layer laminated on the flexible substrate in the first area for displaying an image; a plurality of wirings extending in the second direction from the first area, aligned in the first direction not to be electrically connected to each other, and laminated on the flexible substrate in the second area; and a first inorganic insulating film laminated on the flexible substrate under the plurality of wirings, in which in the second area, the lower base surface of the plurality of wirings is in contact with the first inorganic insulating film including a stepped portion including a plurality of upper surfaces having mutually different heights and being adjacent to each other in the second direction, and a stepped surface rising from the plurality of upper surfaces except the uppermost surface, the first inorganic insulating film constitutes at least the plurality of upper surfaces except the lowest surface, and the stepped surface, the adjacent wirings include a pair of convex portions protruding toward a direction facing each other, and one and the other of the pair of convex portions are separated to face each other at a position where the stepped portion does not exist in the second area in the first inorganic insulating film.

According to the present invention, even when a conductive film remains in the stepped portion when the plurality of wirings are formed, it is possible to cut out the conduction of adjacent wirings and to prevent a short circuit between wirings.

The display device includes the TFT array substrate and a pixel electrode provided above the circuit layer and electrically connected to the circuit layer.

DETAILED DESCRIPTION

Figure 1:
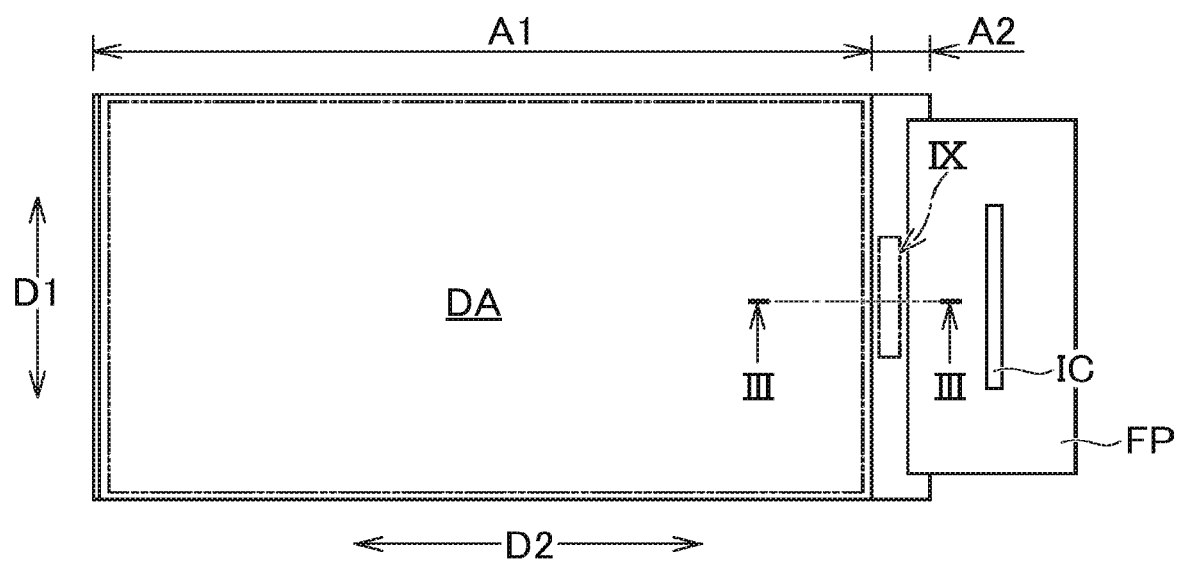
FIG. 1 is a schematic plan view of a display device according to an embodiment of the present invention.

Hereinafter, embodiments of the present invention will be described with reference to the accompanying drawings. However, the present invention can be implemented in various aspects in a range without departing from the gist thereof and is not intended to be construed as being limited to the description of the embodiments exemplified below.

In order to make the description more clearly, the drawings may schematically represent the width, thickness, shape, and the like of each part as compared to the actual embodiment, but are merely examples and not intended to limit the interpretation of the present invention. In the specification and the drawings, the elements having the same functions as those described with reference to the foregoing drawings are denoted by the same reference numerals, and the repeated descriptions thereof may be omitted.

In the detailed description of the present invention, when defining a positional relationship of one component and other components, the terms "above" and "below" are used to include not only the case when the one component is located immediately above or immediately below the other components, but also the case when another component is further interposed therebetween, unless otherwise noted.

Figure 2:
FIG. 2 is a schematic side view of the display device according to the embodiment of the present invention.

FIG. 1 is a schematic plan view of a display device according to an embodiment of the present invention. FIG. 2 is a schematic side view of the display device according to the embodiment of the present invention. The display device is an organic electroluminescence display device. The display device is configured to form a full-color pixel by combining a plurality of color unit pixels (sub-pixels) constituted of, for example, red, green and blue colors to display a full-color image in a display area DA. The display device is connected to a flexible printed board FP. On the flexible printed board FP, an integrated circuit chip IC for driving elements for displaying an image is mounted.

Figure 3:
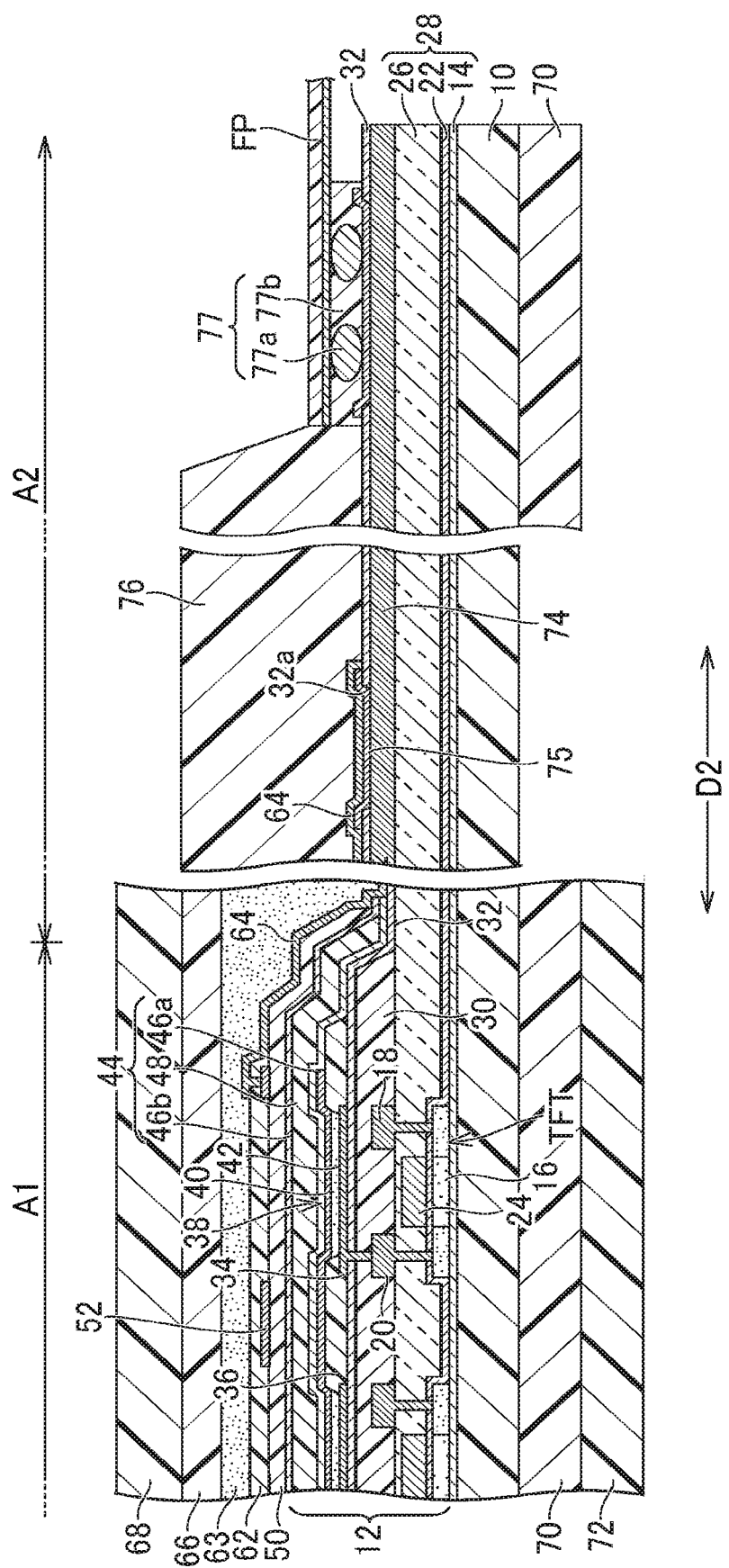
FIG. 3 is an enlarged view of a cross-section taken along line of the display device of FIG. 1.

FIG. 3 is an enlarged view of a cross-section taken along line of the display device of FIG. 1. The display device includes a flexible substrate 10. The flexible substrate 10 has a width in a first direction D1 and a length in a second direction D2 orthogonal to the first direction D1 as illustrated in FIG. 1. The flexible substrate 10 includes a first area A1 including the display area DA. The first area A1 is laminated with a display circuit layer 12 for displaying an image. The flexible substrate 10 includes a second area A2 adjacent to the first area A1 in the second direction D2.

In the flexible substrate 10, an undercoat layer 14 made of an inorganic insulating material is formed to be a barrier against impurities, and a semiconductor layer 16 is formed on the undercoat layer 14. A source electrode 18 and a drain electrode 20 are electrically connected to the semiconductor layer 16, and a gate insulating film 22 made of an inorganic insulating material is formed to cover the semiconductor layer 16. A gate electrode 24 is formed on the gate insulating film 22, and an interlayer insulating film 26 made of an inorganic insulating material is formed to cover the gate electrode 24. The source electrode 18 and the drain electrode 20 are penetrating the gate insulating film 22 and the interlayer insulating film 26. The semiconductor layer 16, the source electrode 18, the drain electrode 20 and the gate electrode 24 constitute at least a part of a thin film transistor TFT.

The undercoat layer 14, the gate insulating film 22 and the interlayer insulating film 26, which are arranged in the first area A1, also reach the second area A2. In the second area A2, the undercoat layer 14, the gate insulating film 22 and the interlayer insulating film 26 are laminated, and other inorganic insulating films are added as necessary to constitute a first inorganic insulating film 28 entirely made of inorganic insulating materials. The first inorganic insulating film 28 is made of a plurality of insulating layers.

In the first area A1, a planarizing layer 30 is provided on the interlayer insulating film 26 to cover the thin film transistor TFT. The planarizing layer 30 is made of an organic insulating material. The planarizing layer 30 is provided in the first area A1 on which the display circuit layer 12 is laminated, and not provided in the second area A2. On the planarizing layer 30, a second inorganic insulating film 32, which is interposed between a pair of electrodes constituting a capacitance for holding an image signal, is laminated. The second inorganic insulating film 32 exceeds the planarizing layer 30 to be in contact with and overlap the interlayer insulating film 26 below the planarizing layer 30. That is, the planarizing film 30 with a high moisture permeability is blocked from moisture by being interposed between the second inorganic insulating film 32 and the interlayer insulating film 26, which have a low moisture permeability.

A plurality of pixel electrodes 34 (for example, anodes), configured to correspond to each of the plurality of unit pixels, are provided on the second inorganic insulating film 32. The pixel electrode 34 is one of the pair of electrodes for constituting the forgoing capacitance. The planarizing layer 30 is formed such that the surface on which at least the pixel electrode 34 is provided in the second inorganic insulating film 32 is planarized. The pixel electrode 34 penetrates the second inorganic insulating film 32 and the planarizing layer 30 to be electrically connected to one of the source electrode 18 and the drain electrode 20 on the semiconductor layer 16.

A bank layer 36 made of an organic insulating material is formed on the second inorganic insulating film 32 and the pixel electrode 34. The bank layer 36 is formed on the periphery of the pixel electrode 34 to open a part (for example, the center part) of the pixel electrode 34. The bank layer 36 forms a bank surrounding a part of the pixel electrode 34. The pixel electrode 34 is a part of a light emitting element 38. The light emitting element 38 further includes a counter electrode 40 (for example, cathode) facing the plurality of pixel electrodes 34, and a light emitting layer 42.

The light emitting layer 42 is provided separately (separated) for each pixel electrode 34 and is also placed on the bank layer 36. In this case, the light emitting layer 42 emits light in blue, red or green corresponding to each pixel. The color corresponding to each pixel is not limited thereto, and may be, for example, yellow, white or the like. The light emitting layer 42 is formed by vapor deposition, for example. Alternatively, the light emitting layer 42 may be formed to extend over the plurality of pixel electrodes 34 on the entire surface covering the display area DA. That is, the light emitting layer 42 may be formed to be continuous on the bank layer 36. In this case, the light emitting layer 42 is formed by coating by solvent dispersion. When the light emitting layer 42 is formed to extend over the plurality of pixel electrodes 34, the light of white color is emitted in the entire sub-pixels, and a configuration having a desired color wavelength portion through a color filter (not illustrated) is obtained.

At least one of a hole injection layer and a hole transport layer, which are not illustrated, is interposed between the pixel electrode 34 and the light emitting layer 42. The hole injection layer or the hole transport layer may be provided separately for each pixel electrode 34, and may be continuous over the entire display area DA illustrated in FIG. 1. The hole injection layer is in contact with the pixel electrode 34 and the bank layer 36.

At least one of an electron injection layer and an electron transport layer, which are not illustrated, is interposed between the counter electrode 40 and the light emitting layer 42. The electron injection layer or the electron transport layer may be provided separately for each pixel electrode 34, and may be continuous over the entire display area DA as illustrated in FIG. 1. The electron injection layer is in contact with the counter electrode 40.

The light emitting layer 42 is interposed between the pixel electrode 34 and the counter electrode 40, and the luminance is controlled by a current flowing therebetween to emit light. The counter electrode 40 is made of a metal thin film or the like and has light transmissivity, thereby transmitting the light generated in the light emitting layer 42 to display an image. The pixel electrode 34 includes a reflective film which reflects the light generated in the light emitting layer 42 in the direction toward the counter electrode 40. The lowermost layer of the plurality of layers is the reflective film, and a layer above the reflective film may be a transparent conductive film.

The light emitting element 38 is blocked from moisture by being sealed by a sealing layer 44. The sealing layer 44 has a structure in which a pair of inorganic films 46a and 46b made of an inorganic material such as silicon nitride sandwich an organic film 48. At least one of the pair of inorganic films 46a and 46b is provided to exceed the bank layer 36 and is in contact with and overlaps the second inorganic insulating film 32 below the bank layer 36. That is, the bank layer 36 with a high moisture permeability is blocked from moisture by being interposed between at least one of the inorganic films 46a and 46b, and the second inorganic insulating film 32, which have a low moisture permeability. The inorganic films 46a and 46b cover up to the ends of the planarizing layer 30 to block moisture and oxygen. Further, since an organic layer 50 is used as a mask when etching the inorganic films 46a and 46b, the tips thereof are aligned with the inorganic films 46a and 46b. As described above, the display circuit layer 12 includes elements for displaying an image. The display circuit layer 12 is provided with a touch electrode 52 for performing touch sensing via the organic layer 50.

Figure 4:
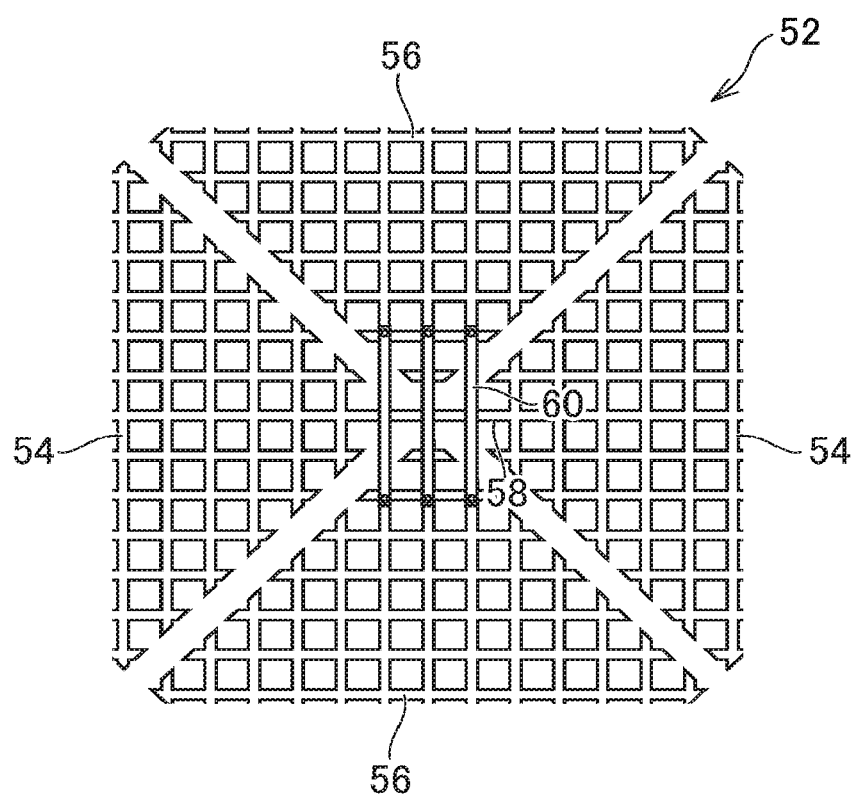
FIG. 4 is a plan view enlarging apart of a touch electrode.

FIG. 4 is a plan view enlarging a part of the touch electrode 52. The touch electrode 52 includes a first pad 54 and a second pad 56. Any one of the first pad 54 and the second pad 56 is on the side transmitting a touch-sensing signal and the other is on the side receiving the touch-sensing signal. The adjacent first pads 54 or the adjacent second pads 56 (in this example, the first pads 54) are connected by a connection wiring 58. The adjacent first pads 54 or the adjacent second pads 56 (in this example, the second pads 56) are connected by a jumper wiring 60.

Figure 5:
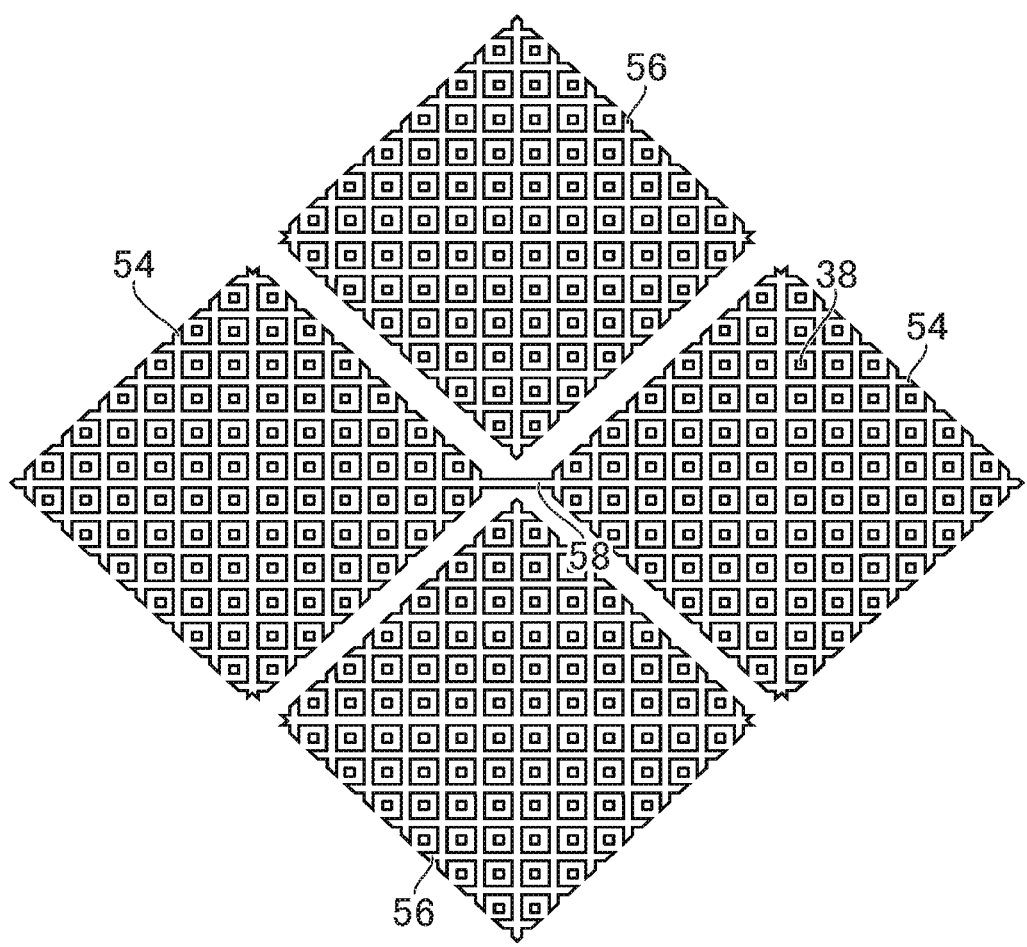
FIG. 5 is a view illustrating a first pad and a second pad.

FIG. 5 is a view illustrating the first pad 54 and the second pad 56. Each of the first pad 54 and the second pad 56 has a diamond shape or a rectangular shape. Since the first pad 54 and the second pad 56 are in the same layer, the optical path lengths are equal when the incident external light is reflected, and thus, the difference in reflection is less likely to appear, which is less likely to be optically and visually recognized. Each of the first pad 54 and the second pad 56 is formed in a mesh shape, and the light emitting elements 38 are arranged in a mesh. Accordingly, even if the first pad 54 and the second pad 56 are formed of metal, light is not blocked. Between the adjacent first pad 54 and second pad 56, a dummy electrode (not illustrated), which is not electrically connected to any of the first pad 54 and the second pad 56, may be disposed. Accordingly, the capacitive coupling of the first pad 54 and the second pad 56 can be made small moderately. As a result, the capacitance change by touch can be enlarged relatively.

As illustrated in FIG. 3, a touch interlayer insulating film 62 is interposed between the layer constituting the first pad 54 and the second pad 56, and the layer constituting the jumper wiring 60. A touch wiring 64 is connected to the touch electrode 52 by passing through the touch interlayer insulating film 62. The touch wiring 64 is provided on the touch interlayer insulating film 62 and is in the same layer as the jumper wiring 60.

Figure 6:
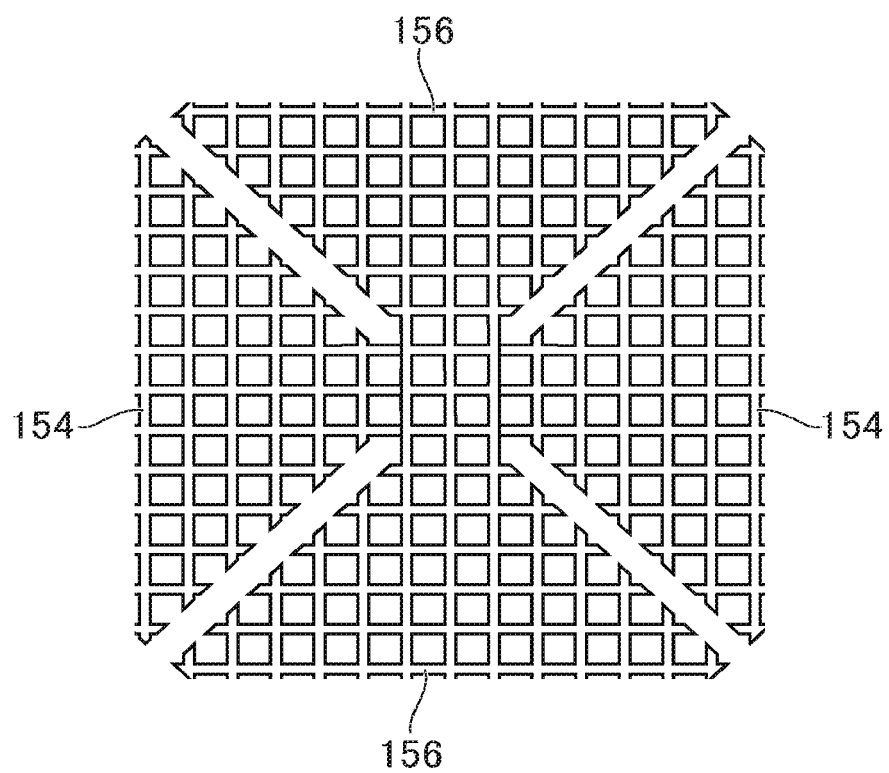
FIG. 6 is a plan view illustrating a modification example of the touch electrode.

FIG. 6 is a plan view illustrating a modification example of the touch electrode. In this example, a plurality of first pads 154 and a plurality of second pads 156 are in different layers, and a touch interlayer insulating film is interposed therebetween. In this structure, since it is not necessary to open a contact for connecting the jumper wiring, defects in the process such as opening failure, generation of particles, and the like are difficult to occur.

As illustrated in FIG. 3, in the first area A1, a front lamination film 66 is attached via an adhesive layer 63 to cover the touch electrode 52, and a polarizing plate 68 is attached thereon. The adhesive layer 63 is provided on the touch interlayer insulating film 62, has a thickness for planarizing irregularities on the surface of the touch interlayer insulating film 62, and has a flat upper surface. A back lamination film 70 is attached to the back surface of the flexible substrate 10 in the first area A1, and a thermal diffusion sheet 72 is attached below the back lamination film 70. The back lamination film 70 is also attached to the second area A2 at a position that overlaps at least the connection portion with the flexible printed board FP.

In the flexible substrate 10, a plurality of wirings 74 are laminated in the second area A2. The plurality of wirings 74 extend in the second direction D2 from the first area A1. The plurality of wirings 74 are aligned in the first direction D1 not to be electrically connected to each other (see FIG. 9). The plurality of wirings 74 include a wiring connected to the touch electrode 52. For example, the wiring 74 illustrated in FIG. 3 is connected to the touch wiring 64. Specifically, in the second area A2, the second inorganic insulating film 32 extends to be interposed between the touch wiring 64 and the wiring 74, and the touch wiring 64 and the wiring 74 are electrically connected through an opening 32a of the second inorganic insulating film 32. A transparent conductive film 75 such as indium tin oxide (ITO) is interposed between the touch electrode 64 and the wiring 74. The transparent conductive film 75 is formed at the same time as a film constituting a part of the pixel electrode 34. An organic insulating film 76 is placed above the second inorganic insulating film 32. The plurality of wirings 74 are electrically connected to the flexible printed board FP at the ends. The electrical connection is made by conductive particles 77a using an anisotropic conductive film 77, and the mechanical connection is made by thermosetting resin 77b.

Figure 7:
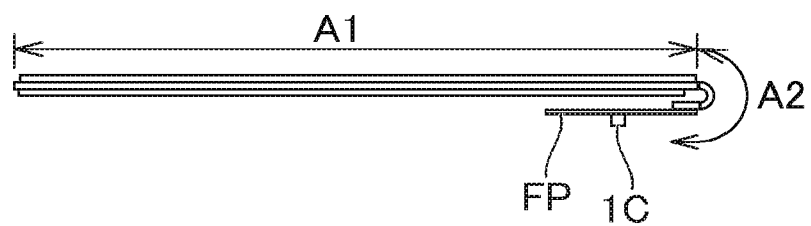
FIG. 7 is a view illustrating a bent state of the display device of the embodiment applied with the present invention.

FIG. 7 is a view illustrating a bent state of the display device of the embodiment applied with the present invention. As illustrated in FIG. 7, the display device can be bent. Specifically, the second area A2 of the flexible substrate 10 illustrated in FIG. 3 (except the joint portion with the flexible printed board FP) is bent. By bending, a part of the display device can be overlapped and miniaturized, and the flexible printed board FP can be disposed on the back side of the display device.

Figure 8:
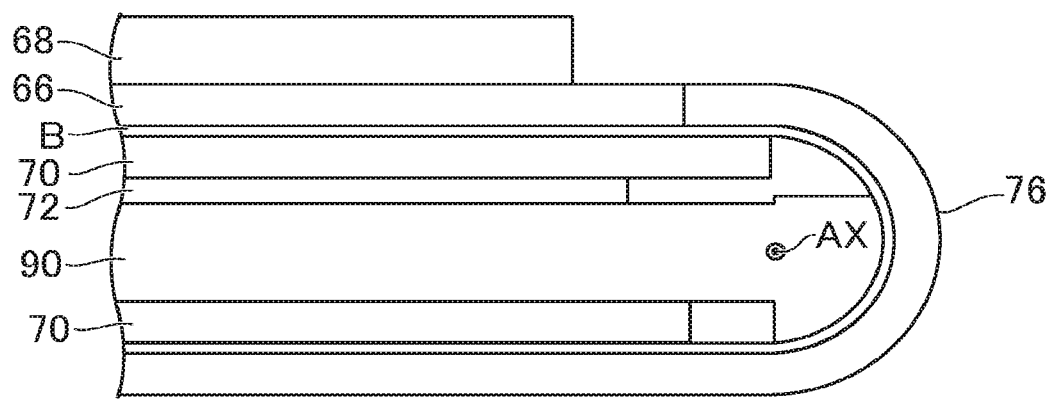
FIG. 8 is a view illustrating a usage example of the display device of the embodiment applied with the present invention.

FIG. 8 is a view illustrating a usage example of the display device of the embodiment applied with the present invention. The display device includes a main body B including the flexible substrate 10, the display circuit layer 12, and the plurality of wirings 74. In the first area A1, the front lamination film 66 and the polarizing plate 68 are provided on the front side of the main body B. Adjacent to these, the organic insulating film 76 is provided in the second area A2. The main body B (flexible substrate 10) is bent around an axis AX extending in the first direction D1. A spacer 90 is disposed on the inner side of the bending to restrict the curvature from becoming too large. On the back side of the main body B, the back lamination film 70 is attached except at least a bent portion.

Figure 9:
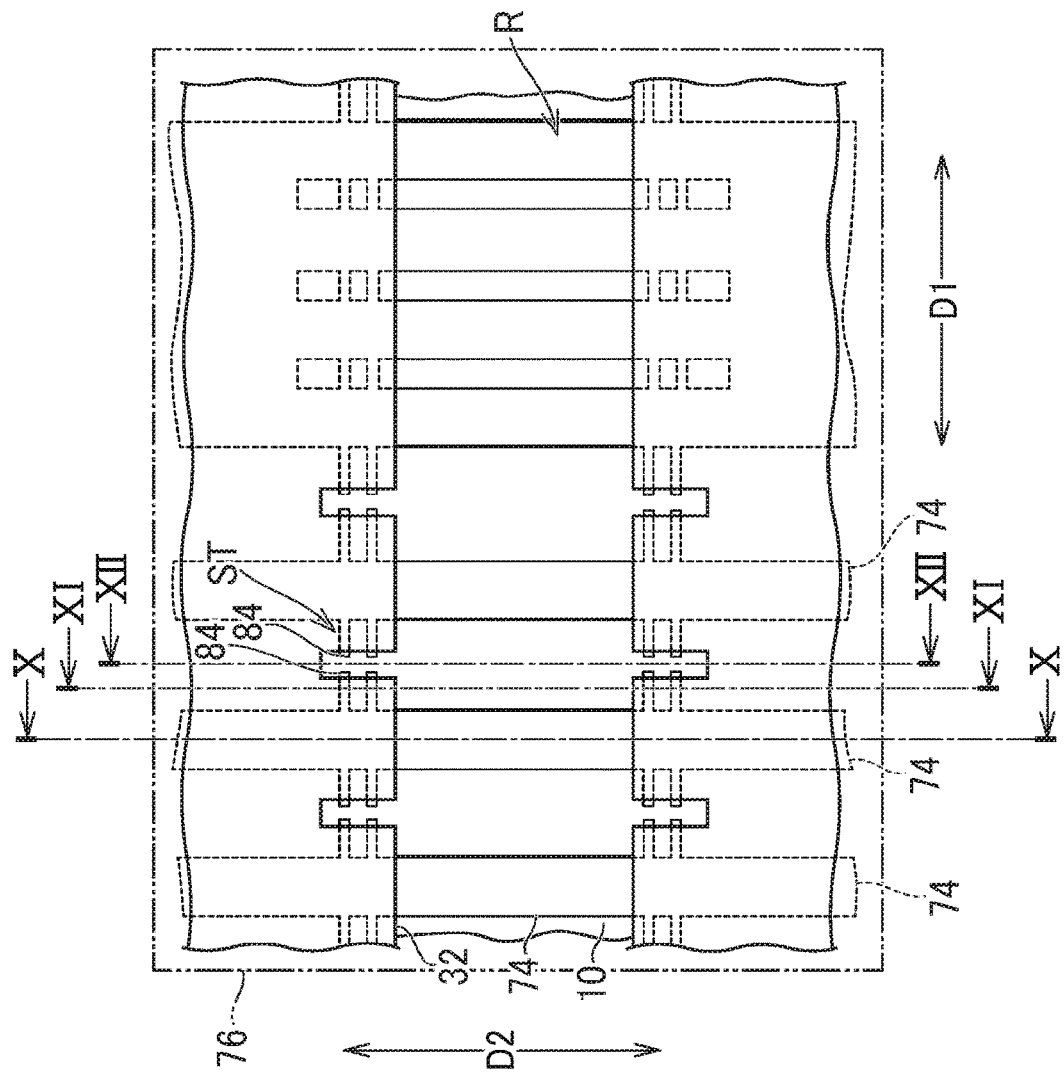
FIG. 9 is an enlarged view of the portion indicated by IX in FIG. 1.
Figure 10:
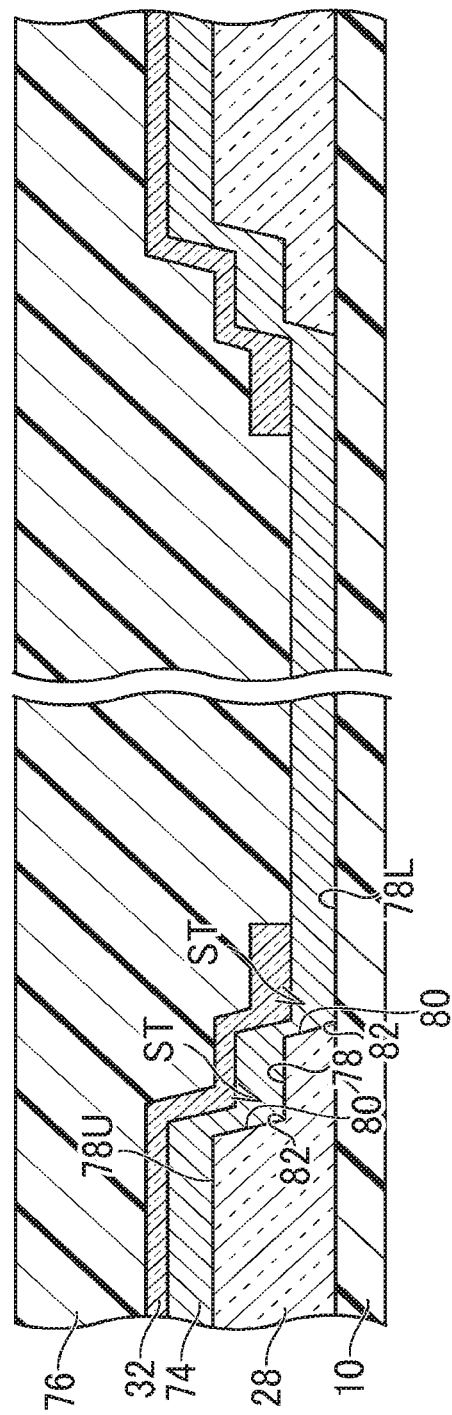
FIG. 10 is a cross-sectional view taken along line X-X of the structure in FIG. 9.
Figure 11:
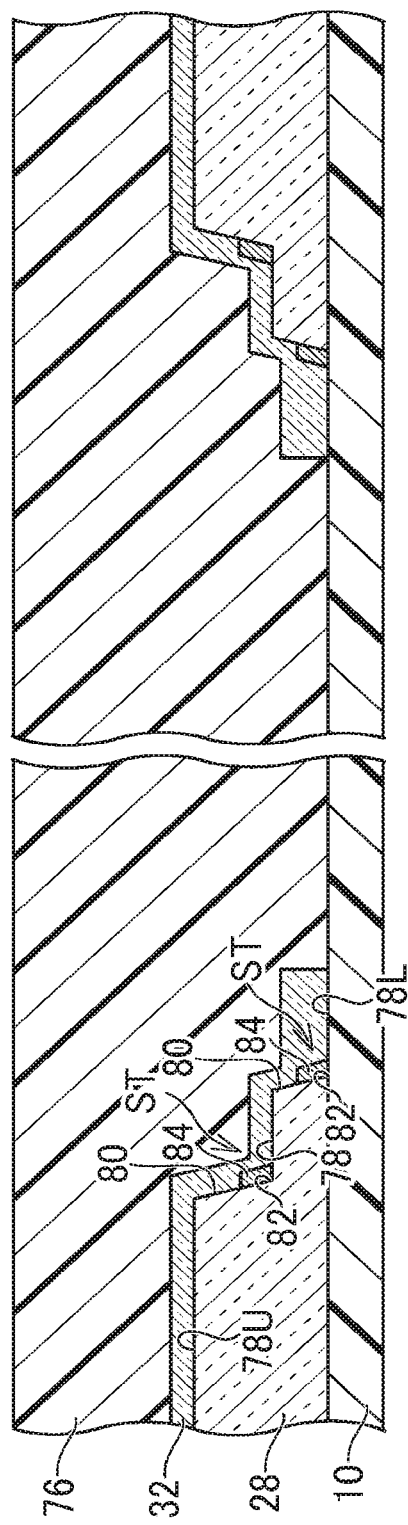
FIG. 11 is a cross-sectional view taken along line XI-XI of the structure in FIG. 9.
Figure 12:
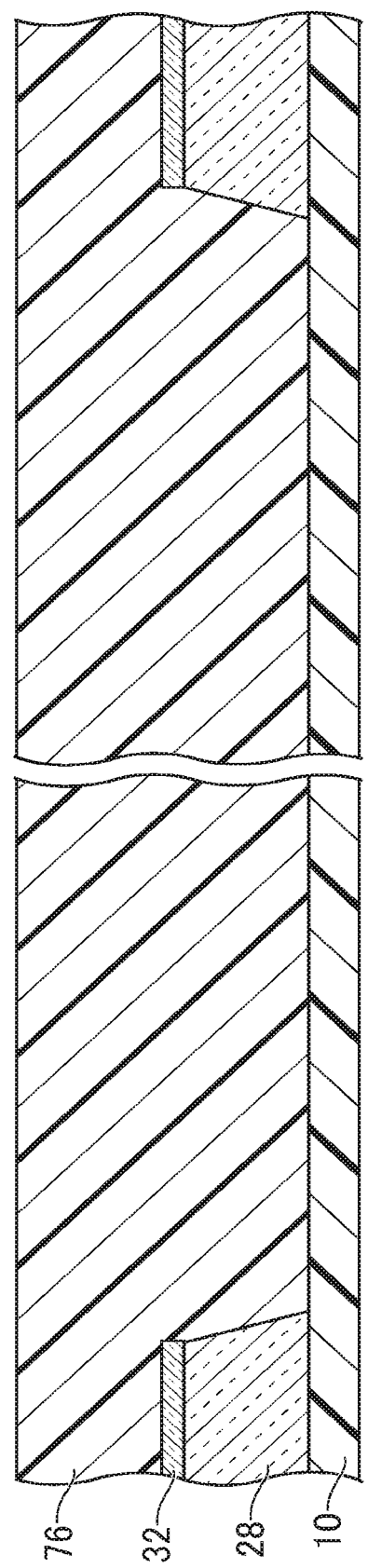
FIG. 12 is a cross-sectional view taken along line XII-XII of the structure in FIG. 9.

FIG. 9 is an enlarged view of the portion indicated by IX in FIG. 1. FIG. 10 is a cross-sectional view taken along line X-X of the structure in FIG. 9. FIG. 11 is a cross-sectional view taken along line XI-XI of the structure in FIG. 9. FIG. 12 is a cross-sectional view taken along line XII-XII of the structure in FIG. 9.

The first inorganic insulating film 28 is below the plurality of wirings 74. In the embodiment, the lower base surface of the plurality of wirings 74 is constituted by the flexible substrate 10 and the first inorganic insulating film 28. On the lower base surface constituted by the flexible substrate 10, there is an area where the first inorganic insulating film 28 does not exist (see FIG. 10). By not providing the hard first inorganic insulating film 28, the flexible substrate 10 is easily bent.

The lower base surface of the plurality of wirings 74 includes a stepped portion ST in the second area A2. The stepped portion ST is formed when a part of the first inorganic insulating film 28 is eliminated. When the first inorganic insulating film 28 includes a plurality of layers, the stepped portion ST includes a plurality of steps. The stepped portion ST includes a plurality of upper surfaces 78 having mutually different heights and adjacent to each other in the second direction D2. A lowest surface 78L of the plurality of upper surfaces 78 is a part of the upper surface 78 of the flexible substrate 10. The stepped portion ST includes stepped surfaces 80 that rise from the plurality of upper surfaces 78 except a uppermost surface 78U. The first inorganic insulating film 28 constitutes at least the plurality of upper surfaces 78 except the lowest surface 78L, and the stepped surfaces 80. In the stepped portion ST, each of the plurality of upper surfaces 78 except the uppermost surface 78U and the stepped surface 80 form a concave corner portion 82.

Each of the wirings 74 includes a convex portion 84 protruding in a direction facing the adjacent wiring 74 (see FIGS. 9 and 11). The convex portion 84 protrudes in the first direction D1 along the concave corner portion 82. A pair of the convex portions 84 of the adjacent wirings 74 protrude in directions facing each other. The pair of convex portions 84 are spaced apart and electrically insulated (see FIG. 9). The convex portion 84 is an etching residue when the plurality of wirings 74 are formed by etching a conductive film 86 described later.

The second inorganic insulating film 32 is on the plurality of wirings 74. The second inorganic insulating film 32 is provided at least in the stepped portion ST to avoid a region R that is continuous in the second direction D2 between the adjacent wirings 74. The region R where the second inorganic insulating film 32 is not provided is a portion to be removed by etching from an inorganic film 88 described later. In the region R where the second inorganic insulating film 32 is removed, the etching residue of the conductive film 86 existing thereunder is also removed together with the inorganic film 88 (details will be described later). Thereby, an interval is formed between the pair of convex portions 84 described above.

When limited to the lowest surface 78L of the plurality of upper surfaces 78, the region R to be avoided by the second inorganic insulating film 32 is continuous over the entire length in the second direction D2 between the adjacent wirings 74 (see FIG. 9). The second inorganic insulating film 32 is provided on the lowest surface 78L of the plurality of upper surfaces 78 to avoid overlapping with at least a part of each of the plurality of wirings 74. The second inorganic insulating film 32 is provided to avoid the region R over the entire width in the first direction D1 when limited to the lowest surface 78L of the plurality of upper surfaces 78.

The organic insulating film 76 is on the second inorganic insulating film 32. The organic insulating film 76 contacts the lower base surface in the region R to be avoided by the second inorganic insulating film 32. The organic insulating film 76 is interposed between the pair of convex portions 84 to prevent a short circuit between the adjacent wirings 74.

Figure 13:
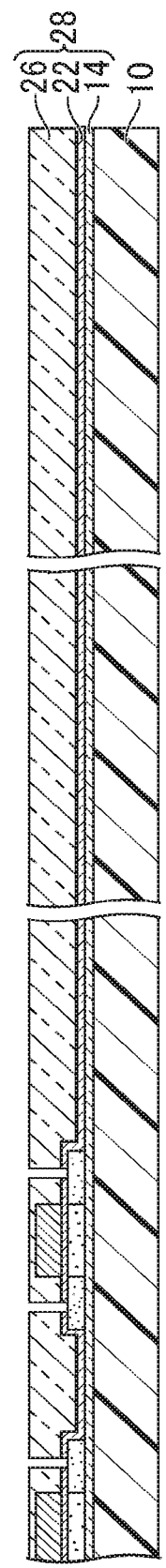
FIG. 13 is a view illustrating a method of manufacturing the display device according to the embodiment of the present invention.

FIGS. 13 to 17 are views illustrating a method of manufacturing the display device according to the embodiment of the present invention. As illustrated in FIG. 13, a laminated structure is formed on the flexible substrate 10 up to the first inorganic insulating film 28. As illustrated in FIG. 3, the first inorganic insulating film 28 is constituted by a plurality of layers (undercoat layer 14, gate insulating film 22, and interlayer insulating film 26), and is patterned by etching applied with photolithography. The patterned first inorganic insulating film 28 constitutes at least a part of the stepped portion ST as illustrated in FIGS. 10 to 12.

Figure 14:
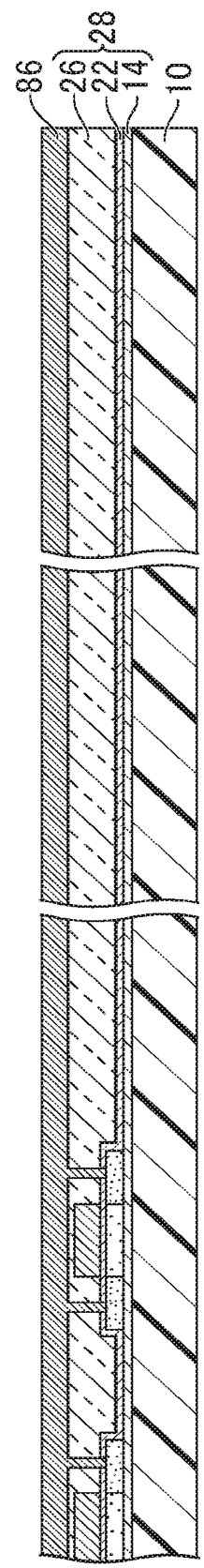
FIG. 14 is a view illustrating the method of manufacturing the display device according to the embodiment of the present invention.
Figure 15:
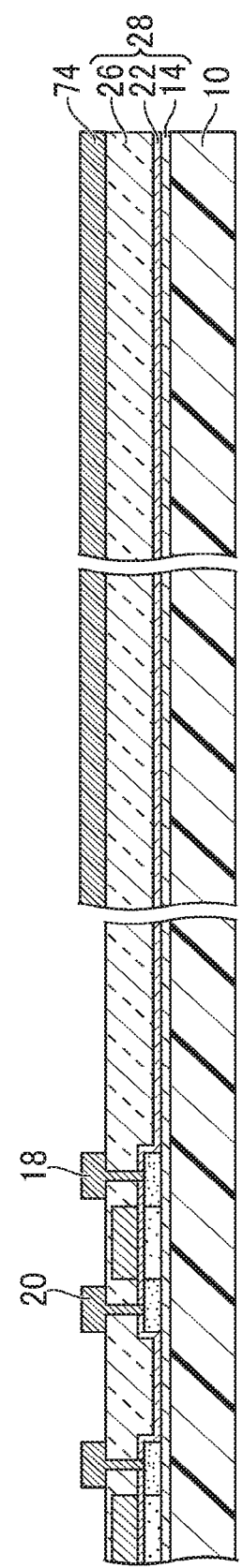
FIG. 15 is a view illustrating the method of manufacturing the display device according to the embodiment of the present invention.

The conductive film 86 is formed in the first inorganic insulating film 28 as illustrated in FIG. 14, and the plurality of wirings 74 are formed by patterning the conductive film 86 as illustrated in FIG. 15. Patterning is performed by etching applied with photolithography. The source electrode 18 and the drain electrode 20 are also formed from the conductive film 86. At this time, since the etchant (for example, an etching solution) is less likely to enter the concave corner portion 82 of the stepped portion ST on the lower base surface of the plurality of wirings 74 (see FIGS. 9 to 12), the conductive film 86 remains. Therefore, the adjacent wirings 74 may be short-circuited.

Figure 16:
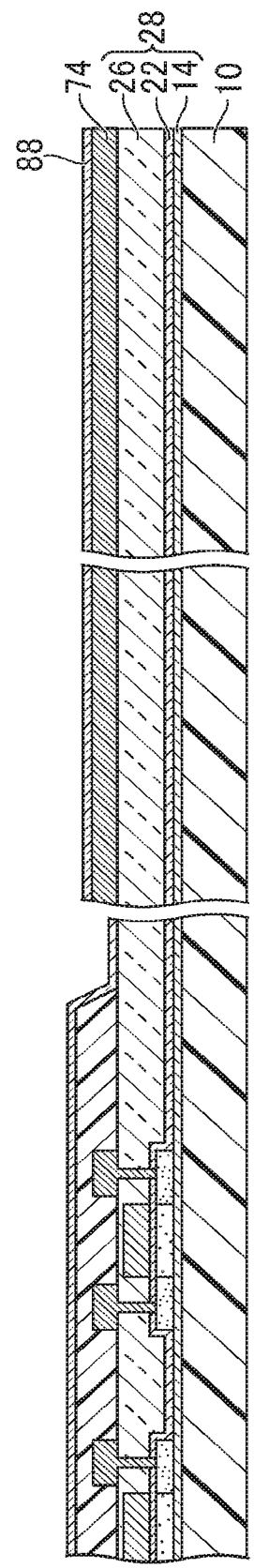
FIG. 16 is a view illustrating the method of manufacturing the display device according to the embodiment of the present invention.
Figure 17:
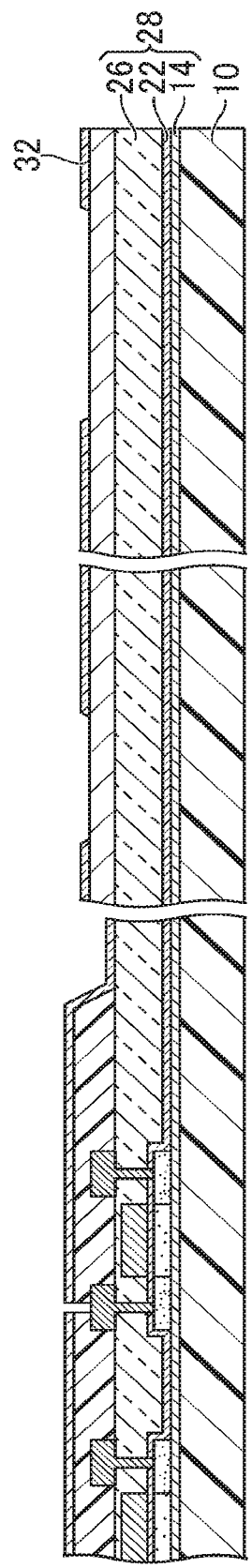
FIG. 17 is a view illustrating the method of manufacturing the display device according to the embodiment of the present invention.

As illustrated in FIG. 16, the inorganic film 88 is formed to cover the plurality of wirings 74, and the inorganic film 88 is patterned as illustrated in FIG. 17. By patterning, at least in the stepped portion ST, the inorganic film 88 is removed from the region R that is continuous in the second direction D2 between the adjacent wirings 74, and the second inorganic insulating film 32 is formed (see FIG. 9). Continuing with the removal of the inorganic film 88, the conductive film 86 remaining between the adjacent wirings 74 (the portion between the pair of convex portions 84) is removed (see FIG. 9). By doing so, the conduction of the adjacent wirings 74 can be cut off. Thereafter, a process obvious from the structure illustrated in FIG. 3 is performed.

Figure 18:
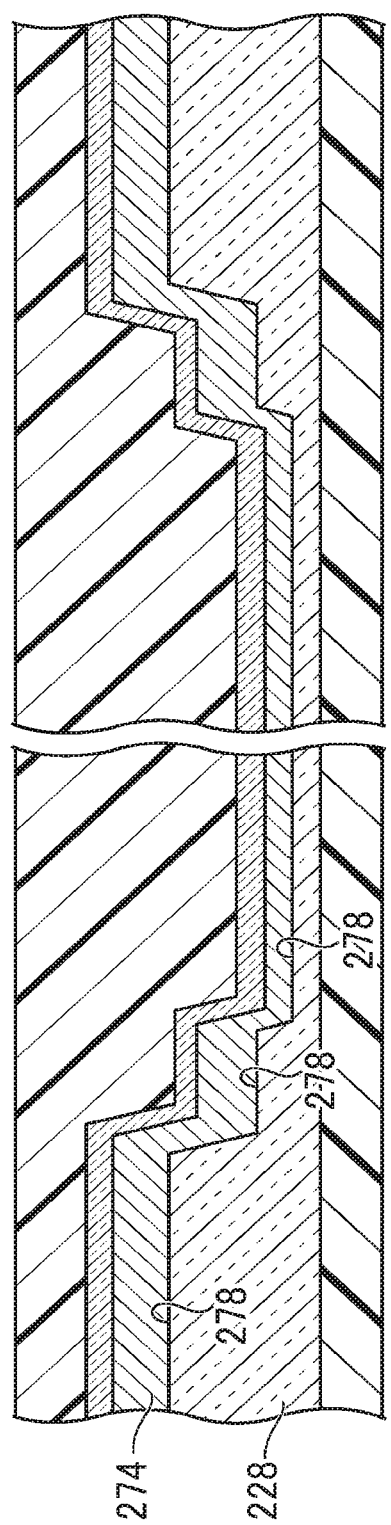
FIG. 18 is a view illustrating a modification of the structure illustrated in FIG. 10.

FIG. 18 is a view illustrating a modification of the structure illustrated in FIG. 10. In this example, each of a plurality of upper surfaces 278 is a part of the upper surface 278 of a first inorganic insulating film 228. That is, the first inorganic insulating film 228 exists below the entirety of a plurality of wirings 274.

Figure 19:
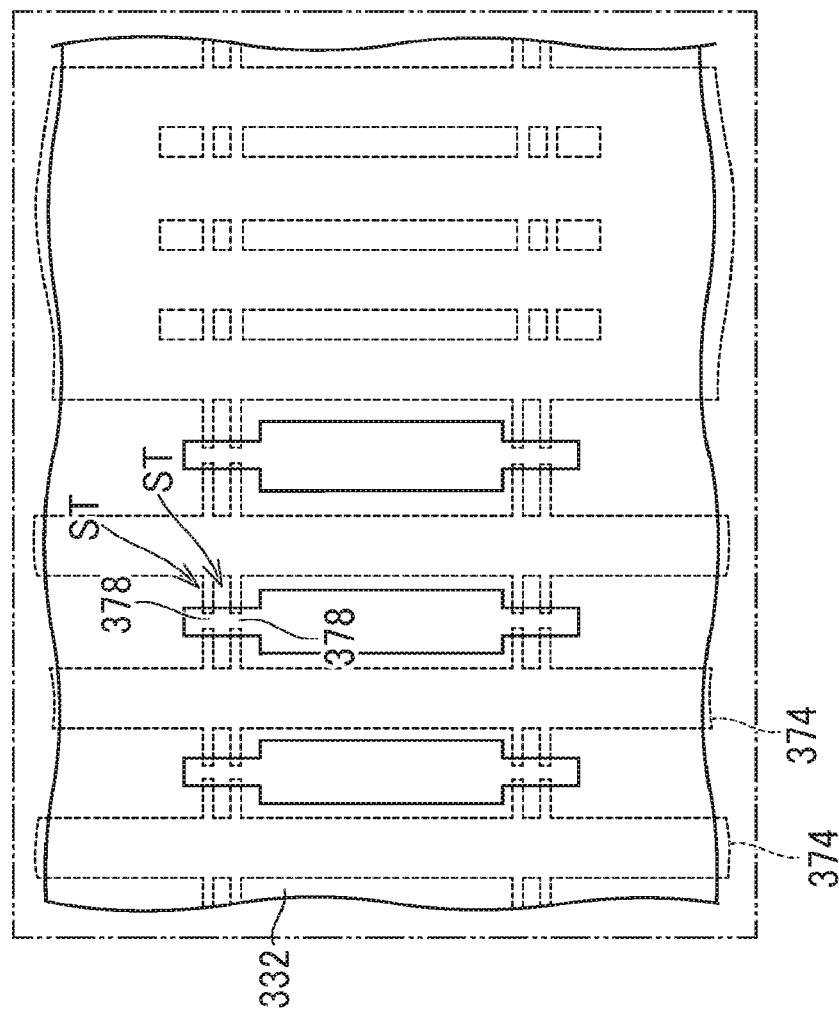
FIG. 19 is a view illustrating a modification of the structure illustrated in FIG. 9.

FIG. 19 is a view illustrating a modification of the structure illustrated in FIG. 9. In this example, a second inorganic insulating film 332 is provided to overlap the entirety of a plurality of wirings 374 also on a plurality of upper surfaces 378 constituting the stepped portion ST.

Figure 20:
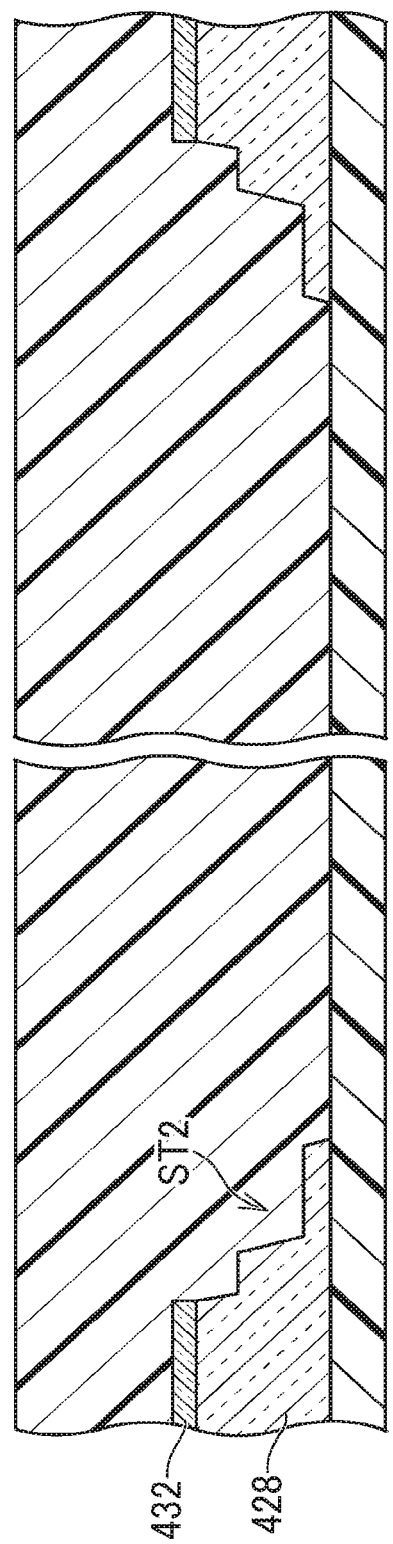
FIG. 20 is a view illustrating a first modification of the structure illustrated in FIG. 12.

FIG. 20 is a view illustrating a first modification of the structure illustrated in FIG. 12. In the example of FIG. 12, a portion of the first inorganic insulating film 28 that protrudes from the second inorganic insulating film 32 is removed in the process of cutting off the conduction between the adjacent wirings 74. On the other hand, in the example of FIG. 20, a first inorganic insulating film 428 includes a portion protruding from a second inorganic insulating film 432. However, in the process of cutting off the conduction between the adjacent wirings 74, in the portion protruding from the second inorganic insulating film 432, the first inorganic insulating film 428 includes a second stepped portion ST2 whose surface layer has been shaved and lowered. Thus, it is not necessary that the first inorganic insulating film 428 does not completely protrude from the second inorganic insulating film 432.

Figure 21:
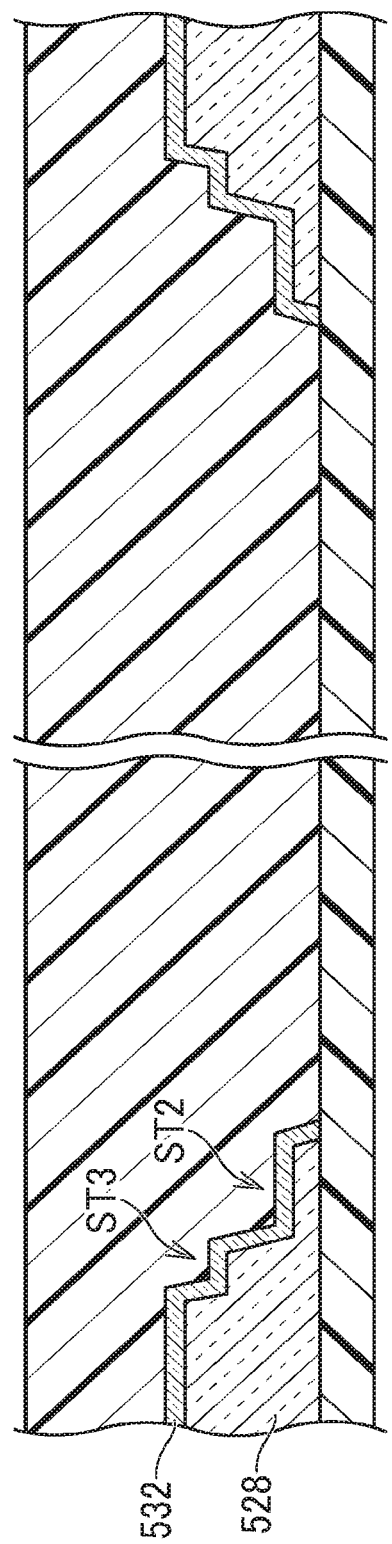
FIG. 21 is a view illustrating a second modification of the structure illustrated in FIG. 12.

FIG. 21 is a view illustrating a second modification of the structure illustrated in FIG. 12. In the example of FIG. 12, the process of cutting off the conduction between the adjacent wirings 74 is performed in the patterning process of the inorganic film 88 for forming the second inorganic insulating film 32. On the other hand, in the example of FIG. 21, after the conduction between the adjacent wirings 74 is cut off, an inorganic film for forming a second inorganic insulating film 532 is formed, and the inorganic film is patterned. Therefore, the second inorganic insulating film 532 covers the side surface of a first inorganic insulating film 528 and extends beyond the periphery. In the example of FIG. 21, since the first inorganic insulating film 528 is etched slightly wider than the place where the stepped portion ST illustrated in FIG. 10 or 11 is present, the second stepped portion ST2 is formed lower and a third stepped portion ST3 is formed by increasing the number of steps by one in a flat region in FIG. 10 or FIG. 11.

The display device is not limited to the organic electroluminescence display device, and may be a display device including a light emitting element such as a quantum-dot light emitting diode (QLED) in each pixel, or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. A TFT array substrate comprising:
a flexible substrate having a width in a first direction and a length in a second direction orthogonal to the first direction and including a first area and a second area adjacent in the second direction;
a circuit layer laminated on the flexible substrate in the first area for displaying an image;
a plurality of wirings extending in the second direction from the first area, arranged in the first direction so as not to be electrically connected to each other, and laminated on the flexible substrate in the second area; and
a first inorganic insulating film laminated on the flexible substrate under the plurality of wirings, wherein
in the second area, the lower base surface of the plurality of wirings is in contact with the first inorganic insulating film including a stepped portion including a plurality of upper surfaces having mutually different heights and being adjacent to each other in the second direction, and a stepped surface rising from the plurality of upper surfaces except the uppermost surface,
the first inorganic insulating film constitutes at least the plurality of upper surfaces except the lowest surface, and the stepped surface,
the adjacent wirings include a pair of convex portions protruding toward a direction facing each other, and
one and the other of the pair of convex portions are separated to face each other at a position where the stepped portion does not exist in the second area in the first inorganic insulating film.

2. The TFT array substrate according to claim 1, wherein the pair of convex portions protrude in the first direction along a concave corner portion formed by each of the plurality of upper surfaces except the uppermost surface, and the stepped surface.

3. The TFT array substrate according to claim 1, wherein the lowest surface of the plurality of upper surfaces is a part of the upper surface of the flexible substrate.

4. The TFT array substrate according to claim 1, wherein each of the plurality of upper surfaces is a part of the upper surface of the first inorganic insulating film.

5. The TFT array substrate according to claim 1, further comprising:
a second inorganic insulating film laminated on the flexible substrate on the plurality of wirings, wherein
the second inorganic insulating film is provided at least in the stepped portion to avoid a region continuous in the second direction between the adjacent wirings.

6. The TFT array substrate according to claim 5, wherein the region to be avoided by the second inorganic insulating film is continuous over the entire length in the second direction between adjacent wirings on the lowest surface of the plurality of upper surfaces.

7. The TFT array substrate according to claim 5, wherein the second inorganic insulating film is provided on the lowest surface of the plurality of upper surfaces to avoid overlapping with at least a part of each of the plurality of wirings.

8. The TFT array substrate according to claim 7, wherein the second inorganic insulating film is provided to avoid the region over the entire width in the first direction on the lowest surface of the plurality of upper surfaces.

9. The TFT array substrate according to claim 5, wherein the second inorganic insulating film is provided on the plurality of upper surfaces to overlap the entirety of the plurality of wirings.

10. The TFT array substrate according to claim 1, further comprising:
an organic insulating film laminated on the flexible substrate on the second inorganic insulating film, wherein
the organic insulating film is in contact with the lower base surface in the region to be avoided by the second inorganic insulating film.

11. The TFT array substrate according to claim 1, wherein the first inorganic insulating film includes a plurality of insulating layers, and the stepped portion is configured to have a plurality of steps.

12. The TFT array substrate according to claim 1, wherein the flexible substrate is bent around an axis AX extending in the first direction.

13. A display device comprising:

the TFT array substrate according to claim 1, and a pixel electrode provided on a circuit layer and electrically connected to the circuit layer.

* * * * *